United States Patent
Mayuzumi

[11] Patent Number: 5,856,652
[45] Date of Patent: Jan. 5, 1999

[54] RADIANT HEATING APPARATUS AND METHOD

[75] Inventor: Masanori Mayuzumi, Annaka, Japan

[73] Assignee: Shin-Etsu Handotai Co., Ltd., Tokyo, Japan

[21] Appl. No.: 804,115

[22] Filed: Feb. 20, 1997

[30] Foreign Application Priority Data

Feb. 28, 1996 [JP] Japan .................................. 8-067355

[51] Int. Cl.⁶ ........................................................ A21B 1/00
[52] U.S. Cl. ........................ 219/405; 219/411; 219/390; 392/416; 392/418; 118/725; 432/241
[58] Field of Search .................................. 219/405, 411, 219/390; 392/416, 418; 432/241

[56] References Cited

U.S. PATENT DOCUMENTS

| | | |
|---|---|---|
| 4,493,977 | 1/1985 | Arai et al. . |
| 5,446,825 | 8/1995 | Moslehi et al. . |
| 5,467,220 | 11/1995 | Xu ............................................ 219/405 |
| 5,556,275 | 9/1996 | Sakata ..................................... 432/241 |
| 5,595,241 | 1/1997 | Jelinek .................................... 219/405 |

FOREIGN PATENT DOCUMENTS

| | | |
|---|---|---|
| A-0695922 | 2/1996 | European Pat. Off. . |
| A-59-34627 | 2/1984 | Japan . |
| A-59-36927 | 2/1984 | Japan . |
| 7-99737 | 4/1995 | Japan . |
| A-2181459 | 4/1987 | United Kingdom . |

*Primary Examiner*—Teresa J. Walberg
*Assistant Examiner*—Quan Nguyen
*Attorney, Agent, or Firm*—Oliff & Berridge, PLC

[57] ABSTRACT

In a radiant heating apparatus, at least an outer radiant heating unit and an inner radiant heating unit located inside the outer radiant heating unit are disposed. A peripheral portion of an article to be treated is mainly heated by the outer radiant heating unit, while a central portion of the article is mainly heated by the internal radiant heating unit. A partition wall is disposed between the outer and inner radiant heating units. Radiation light emitted by each radiant heating unit is reflected by the partition wall so that the radiation light is separated from that emitted by the other radiant heating unit, whereby an area is defined in which the article is heated by each radiant heating unit. Accordingly, a larger article, particularly a substrate-shaped article, can be heated uniformly.

15 Claims, 3 Drawing Sheets

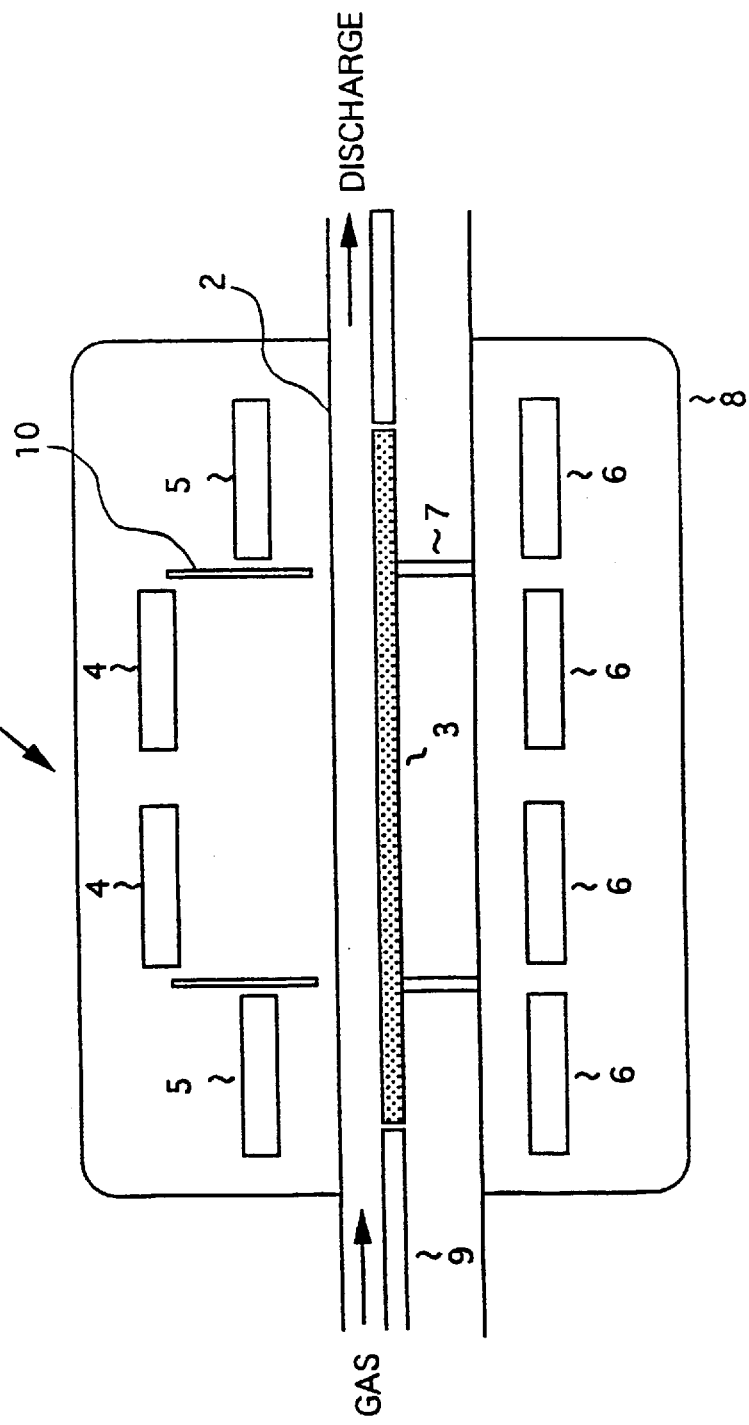

RADIANT HEATING APPARATUS AND METHOD

BACKGROUND OF THE INVENTION

1. Field of the Invention

The present invention relates to a radiant heating apparatus and method for heating an article to be treated or processed, and more particularly to a radiant heating apparatus and method which can heat uniformly a large article such as a semiconductor or quartz glass substrate having a large size or diameter in various kinds of processes in which the article is subjected to, for example, heat treatment, film growth by CVD or epitaxial growth, or a like process.

2. Description of the Related Art

Recently, associated with a considerable increase in the degree of integration of a semiconductor circuit, the area of one device chip has increased. As a result, the diameter of a semiconductor substrate which serves as a base material has become increasingly larger. In the case where devices are formed on such a semiconductor substrate, a heating apparatus or the like, which carries out various heat treatments for a quartz substrate used as a photomask or a semiconductor substrate, inevitably increases due to an increase in the size of the semiconductor substrate.

As a result of an increase in the size of the semiconductor substrate, the quartz substrate, or peripheral members such as a heating apparatus, a temperature distribution inevitably arises when an article to be treated is subjected to various kinds of heat treatments. This makes it difficult to uniformly heat the article to be treated.

For example, if an article such as a semiconductor substrate is uniformly heated, formation of a slip dislocation, variation in the thickness of a grown film, or various types of degradation of electrical characteristics may occur. As a result, the yield of device chips formed from one semiconductor substrate is considerably degraded.

For example, presently the dominant diameter of a semiconductor silicon substrate is in the course of shifting from 150 mm to 200 mm. The future shift of the diameter to 300 mm or more is regarded to be inevitable. In the thermal treatment of a substrate having such a large diameter, further deterioration of the temperature distribution within the plane of the substrate is expected. There is a demand for a heating apparatus and method capable of uniformly heating a semiconductor substrate, an article to be treated.

SUMMARY OF THE INVENTION

The present invention has been conceived in view of the previously-described drawbacks. An object of the present invention is to provide a radiant heating apparatus and method which can uniformly heat a larger article to be treated, particularly a substrate-shaped article, such as a semiconductor or quartz glass substrate having a large diameter or size.

To achieve the above object, the present invention provides an improved radiant heating apparatus which uses a plurality of radiant heating units to heat an article to be treated. The radiant heating apparatus includes a partition wall for separating radiant light emitted by each radiant heating unit from that emitted by the other radiant heating unit(s) so as to define an area in which the article to be treated is heated by each radiant heating unit.

Preferably, the partition wall is disposed between radiant heating units and extending towards the article to be treated.

Preferably, the partition wall is separated at a predetermined distance from the article to be treated, so that the temperature distribution in the article becomes uniform. More preferably, the surface of the partition wall of the present invention is mirror-finished. Further, the mirror-finished surface of the partition wall is preferably coated with gold.

Preferably, the partition wall is disposed on the side corresponding to the main face of the article to be treated and/or the side corresponding to the reverse face of the article.

The present invention also provides an improved radiant heating method which uses at least an outer heating unit and an inner heating unit located inside the outer radiant heating unit. In the radiant heating method, the peripheral portion of an article to be treated is mainly heated by the outer radiant heating unit, while the central portion of the article to be treated is mainly heated by the internal radiant heating unit. Radiation light emitted by each radiant heating unit is reflected by a partition wall so that the radiation light is separated from that emitted by the other radiant heating unit so as to define an area in which the article to be treated is heated by each radiant heating unit. Preferably, the radiant intensities of the outer and inner heating units are controlled independently of each other.

Preferably, the main face of the article to be treated is heated by the inner and outer radiant heating units disposed on the side corresponding to the main face of the article, while the reverse face of the article is heated by a lower radiant heating unit disposed on the side corresponding to the reverse face of the article.

Alternatively, the main face of the article to be treated is heated by the outer radiant heating unit disposed on the side corresponding to the main face of the article, while the reverse face of the article is heated by the lower radiant heating unit disposed on the side corresponding to reverse face of the article to be treated.

Preferably, the article to be treated is a silicon monocrystalline substrate, and a part of the reverse face and/or the side surface of the substrate is supported during treatment.

In the radiant heating apparatus and method of the present invention, the partition wall separates radiant light emitted by each radiant heating unit from that by the other radiant heating unit(s) so as to define an area in which an article to be treated is heated by each radiant heating unit. The outer radiant heating unit heats mainly the peripheral portion of the article, and the inner radiant heating unit heats mainly the central portion of the article. The partition wall separates and reflects the radiant light emitted from each radiant heating unit, as a result of which the area in which the article is heated by each radiant heating unit is defined. Accordingly, it is possible to easily and uniformly heat the article to be treated, without increasing the size of the radiant heating apparatus, through combined use of the radiant heating units and through independent adjustment and control of the radiation intensities.

A future further increase in the diameter of a wafer will make it more difficult to carry out heat treatment through uniform heating of the wafer. Therefore, the radiant heating apparatus of the present invention is very valuable for use in various kinds of heat treatment processes for a semiconductor substrate, CVD growth, epitaxial growth, and like processes.

BRIEF DESCRIPTION OF THE DRAWINGS

FIG. 1 is a schematic cross-sectional view showing an embodiment of a radiant heating apparatus of the present invention;

FIGS. 2A–2C are graphs showing the results of measurement of temperature distribution on a silicon wafer after the silicon wafer has been heated by each of radiant heating units, wherein FIG. 2A shows temperature distributions obtained when the silicon wafer was heated by the inner radiant heating unit only, FIG. 2B shows temperature distributions obtained when the silicon wafer was heated by the outer radiant heating unit only, and FIG. 2C shows temperature distributions obtained when the silicon wafer was heated by lower radiant heating unit only;

DESCRIPTION OF THE INVENTION AND PREFERRED EMBODIMENT THEREOF

Figure 2A:
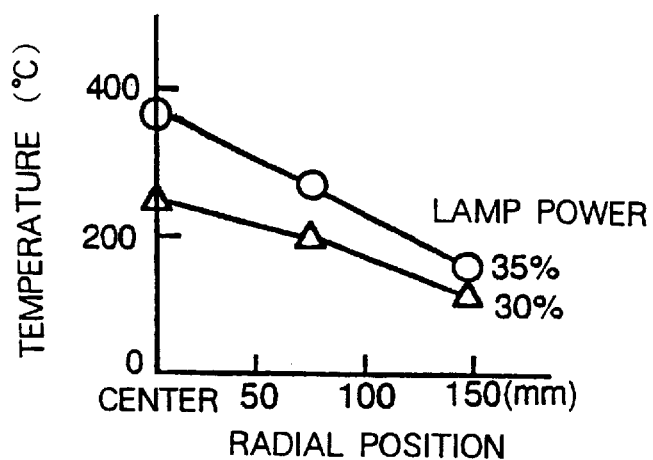

The present invention will now be described hereinbelow in more detail.

An apparatus as disclosed in, e.g., Japanese Patent Publication (kokoku) No. 7-99737 has already been known as a radiant heating apparatus for use in carrying out various heat treatments, CVD film growth, epitaxial growth, or the like for an article to be treated. In the apparatus, a semiconductor substrate, which is an article to be treated, is held in a domed reaction vessel, while a gas is introduced into the reaction vessel. The article is heated by a plurality of radiant heating units disposed outside the reaction vessel, whereby the article can be subjected to a desired treatment.

In the apparatus, the radiant heating units that act as a source of heat are disposed on the upper and lower sides of the article to be treated. On each side, lamps that constitute the corresponding radiant heating unit or units are arranged into two or more concentric circles. The radiation intensities of the outer and inner radiant heating units disposed on the upper side can be independently adjusted and controlled. As a result, it is possible for the article to be treated to have a uniform temperature distribution in the radial direction.

As a result of various experimental studies carried out by the inventors of the present invention, it was found that it was difficult to uniformize the inplane temperature distribution of the article to be treated in such a radiation heating unit. Particularly in the case where a large substrate having a diameter of more than 300 mm is thermally treated as the article to be treated, a tendency was found in which the temperature increased at the central portion of the article and decreased at the peripheral portion of the article.

The details of this phenomenon are not necessarily evident. However, in the case of radiant heating, emission of radiant light acts as a source of heat, and the article to be treated is disposed in an atmosphere surrounded by the reaction vessel. However, the radiant light is scattered by reflection or the like and, hence, is apt to concentrate at the central portion of the reaction vessel. Further, if radiant lamps are arranged in a circular pattern, the radiant light becomes more apt to concentrate at the central portion of the circular pattern to a much greater extent. Even if the radiant heating units are divided into an outer layout and an inner layout, the temperature distribution of each radiant heating unit solely increases the temperature of the central portion of the article to be treated. Therefore, even if the radiation intensity of each radiant heating unit is adjusted and controlled independently, it is impossible to uniformize the inplane temperature distribution of the article to be treated. More specifically, a sufficient amount of radiant light does not impinge on the peripheral portion of the article to be treated. For this reason, the temperature of the periphery decreases, whereas the temperature of the center increases.

Therefore, in the conventional radiant heating apparatus, the positions of the radiant heating units are changed, or the number of radiant heating units is increased meaninglessly, thereby resulting in a complicated or bulky apparatus. However, in actuality, it is difficult to sufficiently increase the temperature of the peripheral portion of the article to be treated so as to uniformize the temperature distribution.

The inventors of the present invention worked on the development of a radiant heating apparatus capable of actually and easily increasing the temperature of the peripheral portion of the article to be treated without increasing the size of the apparatus, and eventually completed the apparatus.

Next, a preferred embodiment of the present invention will be described with reference to the drawings.

FIG. 1 is a schematic cross-sectional view showing the embodiment of a radiant heating apparatus of the present invention.

In the radiant heating apparatus 1 shown in FIG. 1, an article to be treated 3 such as a semiconductor substrate is disposed at the center or its vicinity of a reaction vessel 2 made of, e.g., transparent quartz, and energy of radiant light from radiant heating units 4, 5 and 6 provided outside the reaction vessel 2 is irradiated on the article 3 for heat treatment.

The reaction vessel 2 is contained in a housing 8 and, depending on its purpose, can be formed into various shapes such as a cylindrical or tubular shape. In the present embodiment, the reaction vessel 2 is formed into a hollow disk shape. The reaction vessel 2 has a structure such that it can be split in a vertical direction at an unillustrated flanged portion thereof by an unillustrated drive section, whereby the article 3 can be loaded into and unloaded from the reaction vessel.

Various kinds of articles are subjected to heat treatment in different manners according to the purpose of the heat treatment. Examples of such articles include semiconductor silicon substrates; compound semiconductor substrates such as GaAs, GaP, or InP; and synthetic quartz substrates. These substrates are usually formed into a thin plate-like shape. The article to be treated 3 is held at the center or its vicinity of the reaction vessel 2 by, e.g., quartz pins 7. A method of holding the article to be treated 3 is not limited to supporting of the article to be treated by the quartz pins; the article to be treated may be retained by use of so-called quartz susceptors, silicon carbide susceptors, susceptors which are made of the same material as that of the article to be treated, or ceramics susceptors which do not turn into impurities during treatment. In order to increase the efficiency in heating the reverse face of the article to be treated, the article is preferably disposed in the radiant heating apparatus in a state in which a part of the reverse face and/or side surface of the substrate is supported.

The article to be treated 3 is subjected to so-called single wafer processing in which substrates are treated one by one. However, the plurality of articles to be treated 3 may be treated at one time. In this case, the "article to be treated" used in claims of the present invention represents a group of articles to be treated at one time.

The radiant heating units are disposed above and below the article to be treated 3. Within each radiant heating unit, radiant lamps are arranged in a circular pattern. Examples of the radiant lamps include infrared lamps and halogen lamps. In the present embodiment, infrared lamps are adopted. The radiant lamps on the side corresponding to the main face (the upper face) of the article to be treated 3 are arranged in a double-circle pattern. As a result, there are formed an inner radiant heating unit 4 for mainly increasing the temperature of the central portion of the article and an outer radiant heating unit 5 for mainly increasing the temperature of the peripheral portion of the article. The radiation intensities of the inner and outer radiant heating units 4 and 5 can be controlled independently of each other. A cylindrical partition wall 10 is disposed between the inner radiant heating unit 4 and the outer radiant heating unit 5 so as to isolate these heating units from each other.

The shape of the partition wall 10 may be arbitrarily determined in accordance with the layout and shape of the radiant heating units, so long as the partition wall 10 can separate and isolate, from other radiant heating units, at least the outer radiant heating unit 5 which mainly increases the temperature of the peripheral portion of the article to be treated. The partition wall 10 may be formed into various shapes. The material of the partition wall 10 is not specifically limited so long as the material is opaque with respect to the light from radiant lamps used in the radiant heating apparatus and the performance thereof does not deteriorate due to high temperatures. For example, metals such as copper, nickel, or iron can be used as the material of the partition wall. The surface of the partition wall is preferably be mirror-finished by being plated with gold, etc. Taking account of the fact that the source of heat is radiant heating, the surface of the partition wall is finished into a mirror surface, so that the directionality of radiant light can be increased, and a desired temperature distribution can be obtained.

Portions of the interior surface of the housing 8 in the vicinity of the radiant heating units 4, 5, and 6 are mirror-finished, whereby the directionality of light toward the article to be treated is improved. Each radiant lamp is compulsively cooled by air and the inner surface of the housing 8, which faces the lamps, is also cooled by air, and in addition, the housing itself is cooled by cooling water.

The lower radiant heating unit 6 for increasing the overall temperature of the article to be treated is disposed on the side corresponding to the reverse face (i.e., the lower face) of the article to be treated 3. The radiation intensities of the inner radiant heating unit 4 and the outer radiant heating unit 5 can be controlled independently of each other. In the present embodiment, only the lower radiant heating unit 6 is disposed below the article to be treated. Accordingly, it is not necessary to dispose a partition wall on the lower side of the article to be treated. However, as on the upper side, two circular radiant heating units may be disposed in a concentric manner below the article, and a partition wall may be disposed such that the outer radiant heating unit increases the temperature of the peripheral portion of the article to be treated 3.

The layout of the lamps that constitute each radiant heating unit is not limited to the previously-described circular pattern. Any suitable pattern may be selected in accordance with the shape of the article to be treated and the shape of the reaction vessel. For instance, the lamps may be uniformly arranged over the entire surface of the article to be treated or may be arranged into an angular pattern. Further, even in the case where the lamps of the radiant heating units are arranged into a circular pattern, they may be arranged to form three or more concentric circles.

The action of the radiant heating apparatus of the present invention shown in FIG. 1 for uniformly heating an article to be treated will be described with reference to the case where the article to be treated 3 is a silicon wafer having a diameter of 300 mm, on which an epitaxial layer is grown.

The silicon wafer is held on quartz pins substantially at the center of the reaction vessel 2 made of transparent quartz. While chrolo-silane and hydrogen are introduced into the reaction vessel 2 as reaction gas and carrier gas, respectively, the silicon wafer is heated to about 800° to 1200° C. using the radiant heating units 4, 5, and 6. As a result, an epitaxial layer of monocrystalline silicon can be grown on the wafer.

In this case, the inner radiant heating unit 4 and the outer radiant heating unit 5 are separately shielded from each other by the cylindrical partition wall 10 which is made of copper, is plated with gold, and has its surface mirror-finished. Radiant light emitted from the inner radiant heating unit 4 directly heats the central portion of the silicon wafer. Further, the radiant light is reflected from the interior surface of the gold-plated partition wall 10, as a result of which the majority of the reflected light also illuminates and heats the central portion of the silicon wafer. In short, as a result of the heating action of the inner radiant heating unit 4, temperature gradient and distribution are obtained in which mainly the temperature of the central portion of the article to be treated becomes high; namely, the temperature of the central portion of the wafer is high, whereas the temperature of the peripheral portion of the wafer is low.

In contrast, the radiant light emanated from the outer radiant heating unit 5 directly heats the peripheral portion of the silicon wafer. Further, the radiant light is reflected from the exterior of the gold-plated partition wall 10 and the interior wall surface of the housing 8. The majority of the reflected light illuminates the peripheral portion of the silicon wafer. As a result, the radiant light is prevented from scattering to the central portion of the wafer. In short, as a result of the heating action of the outer radiant heating unit 5, temperature gradient and distribution are obtained in which mainly the temperature of the peripheral portion of the article to be treated becomes high; namely, the temperature of the peripheral portion of the wafer is high, whereas the temperature of the central portion of the wafer is low.

The combination of the inner radiant heating unit 4 and the outer radiant heating unit 5, whose radiation intensities are controlled independently of each other, makes it possible to separately adjust and control the radiation intensities of light at the center portion and peripheral portion of the wafer. As a result, it becomes possible to uniformly heat a silicon wafer having a diameter equal to or greater than 300 mm. In other words, individual single radiant heating unit intentionally and locally provides a temperature gradient. By combination of such radiant heating units, and by independent adjustment and control of the power of each radiant heating unit, the article to be treated can be uniformly heated.

The partition wall 10 is intended to define the respective areas heated by the inner and outer radiant heating units by separating the radiant light from one of the heating units from the radiant light from the other. However, for example, if the radiant light emitted from the inner radiant heating unit is completely isolated from the radiant light from the outer radiant heating unit by means of the partition wall 10 such that the radiant light emitted from the inner radiant heating unit is completely prevented from illuminating the peripheral portion of the article to be treated 3, and the radiant light emitted from the outer radiant heating unit is completely prevented from illuminating the central portion of the article to be treated 3, a temperature distribution on the article to be treated 3 in the vicinity of the partition wall 10 becomes uneven.

To prevent this problem, a predetermined distance is ensured between the partition wall 10 and the article to be treated 3 so that the peripheral portion of the article to be treated 3 can be slightly heated by the radiant light emitted from the inner radiant heating unit and the central portion of the article to be treated 3 can be slightly heated by the radiant light emitted from the outer radiant heating unit. As a result, the temperature distribution on the article to be treated 3 becomes uniform. In the present embodiment, it was acknowledged that the temperature distribution on the silicon wafer 3 became uniform when the distance between the lower edge of the partition wall 10 and the silicon wafer 3 was set to 30 to 40 mm.

In this case, since the lower radiant heating unit 6 is not provided with a partition wall, the radiant light is reflected and scattered, as a result of which the entire silicon wafer is heated. As previously described, the radiant light is apt to concentrate at the central portion of the article to be treated. Consequently, the temperature of the central portion of the article to be treated becomes high. However, the area in which the radiant light illuminates the article to be treated is not defined by the partition wall, and therefore a resultant temperature gradient becomes milder than that produced by the inner radiant heating unit 4. Accordingly, for the purpose of uniformly heating the silicon wafer which is the article to be treated, the heating carried out by the lower radiant heating unit 6 is not necessarily required. However, the heating action of the lower radiant heating unit 6 contributes to a quick increase in the temperature of the article to be treated to a desired temperature and a stable heating operation. In addition, the heating carried out by the lower radiant heating unit 6 is required when a high-temperature heat treatment is carried out.

In consequence, combination of the radiant heating units which enables uniform heating of the article to be treated in the present embodiment is not limited solely to the combination of the inner radiant heating unit 4 and the outer radiant heating unit 5, and also includes combination of the outer radiant heating unit 5 and the lower radiant heating unit 6, and to combination of the inner radiant heating unit 4, the outer radiant heating unit 5, and the lower radiant heating unit 6.

EXAMPLES

A semiconductor silicon monocrystalline wafer having a diameter of 300 mm was actually heated using the radiant heating apparatus of the present invention shown in FIG. 1, and the temperature distribution was measured.

In the test examples, a cylindrical partition wall 10 that had a diameter of 190 mm and a height of 135 mm and had its surface mirror-finished and coated with gold was interposed between the inner radiant heating unit 4 and the outer radiant heating unit 5 so as to face the main face of the silicon wafer. In this case, the distance between the lower edge of the partition wall 10 and the silicon wafer was 35 mm.

Example 1

Figure 2B:
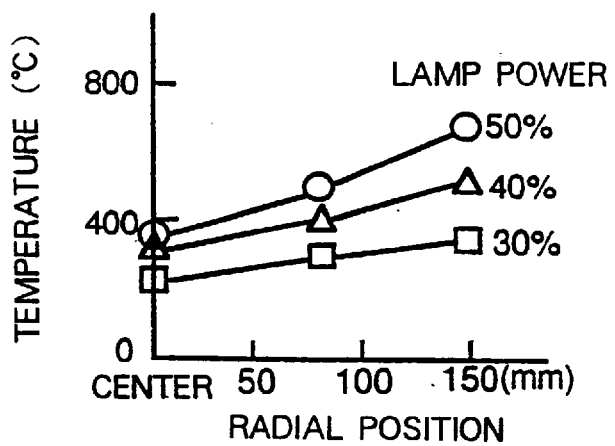
Figure 2C:
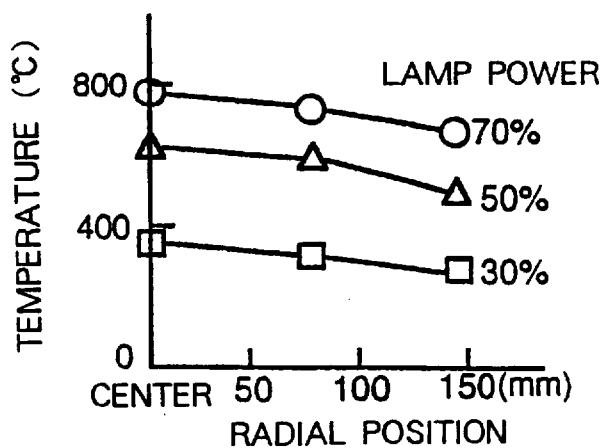

A heating operation of each single radiant heating unit was carried out, then a temperature distribution on the silicon wafer was measured. The results are shown in FIG. 2A–2C. FIG. 2A shows temperature distributions obtained as a result of the heating operation carried out solely by the inner radiant heating unit 4. FIG. 2B shows temperature distributions obtained as a result of the heating operation carried out solely by the outer radiant heating unit 5. FIG. 2C shows temperature distributions obtained as a result of the heating operation carried out solely by the lower radiant heating unit 6.

As is apparent from the results, the heating action carried out solely by the inner radiant heating unit 4 mainly increased the temperature of the central portion of the wafer. A temperature difference between the central portion and peripheral portion of the silicon wafer became large. In short, the heating action made it possible to heat the central portion of the silicon wafer in a concentrated manner (FIG. 2A). In contrast, the heating action carried out solely by the outer radiant heating unit 5 resulted in an increase in the temperature of the peripheral portion of the silicon wafer. It can be seen that the partition wall could effectively prevent the radiant light from scattering (FIG. 2B). The heating action carried out solely by the lower radiant heating unit 6 resulted in the overall silicon wafer having been heated because of absence of the partition wall. It is understood that the temperature distributions shown in FIG. 2C are milder than those shown in FIG. 2A, and that the central portion of the silicon wafer was increased to high temperatures (FIG. 2C).

Accordingly, it is understood that when heating is performed by combination of the inner radiant heating unit 4 and the outer radiant heating unit 5, combination of the outer radiant heating unit 5 and the lower radiant heating unit 6, or combination of the inner radiant heating unit 4, the outer radiant heating unit 5 and the lower radiant heating unit 6, the article can be heated uniformly.

Example 2

A heating operation was then carried out by combination of the outer radiant heating unit 5 and the lower radiant heating unit 6. The target temperature of the silicon wafer was set to 510° C., and the power supplied to each of the outer radiant heating unit 5 and the lower radiant heating unit 6 was adjusted so as to uniformize the inplane temperature distribution of the wafer. The result is shown in FIG. 3.

Figure 3:
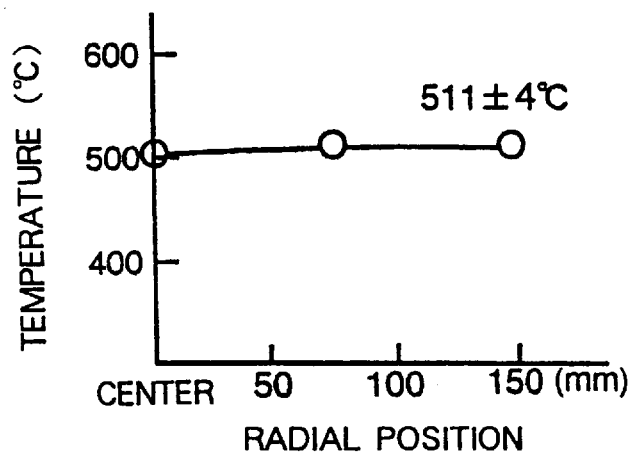
FIG. 3 is a graph showing the results of measurement of inplane temperature distribution of a wafer obtained when the wafer was heated by combined use of the outer radiant heating unit and the lower radiant heating unit.

As is apparent from FIG. 3, the temperature difference between the central portion and peripheral portion of the wafer was eliminated by use of the radiant heating apparatus of the present invention, and that the silicon wafer could be heated while the inplane temperature distribution was maintained uniform.

Comparative Example

The partition wall 10 was removed from the radiant heating apparatus shown in FIG. 1, and the silicon wafer was heated solely by use of the outer radiant heating unit 5. The temperature distribution on a silicon wafer having a diameter of 300 mm was measured. The measurement result was provided in FIG. 4.

Figure 4:
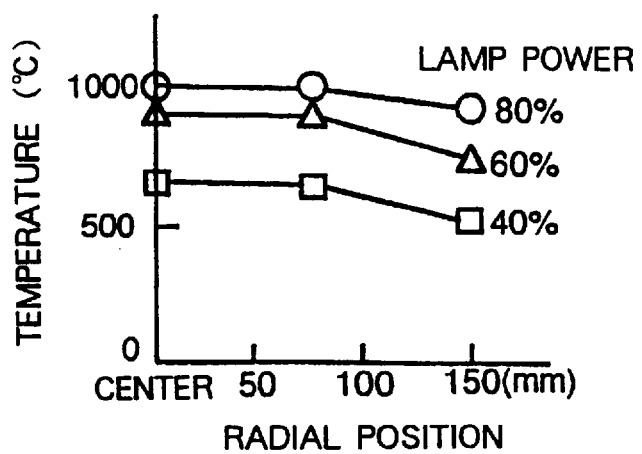
FIG. 4 is a graph showing the results of measurement of temperature distribution on a silicon wafer obtained when the wafer was heated by the outer radiant heating unit only in a state in which the partition wall was removed from the radiant heating apparatus shown in FIG. 1.

As is apparent from FIG. 4, heating through sole use of the outer radiant heating unit 5 without the partition wall caused the radiant light to scatter to the central portion of the silicon wafer by reason of the absence of the partition wall, whereby the temperature of the central portion of the silicon wafer was increased to a high temperature. This temperature distribution is analogous to the temperature distribution which is shown in FIG. 2C and was obtained as a result of heating the silicon wafer solely by use of the lower radiant heating unit 6. Even if combined with the inner radiant heating unit 4 and the lower radiant heating unit 6, the outer radiant heating unit 5 which provides the previously-described temperature distribution due to sole heating, cannot heat an article to be treated with a uniform temperature distribution.

The present invention is not limited to the above-described embodiment. The above-described embodiment is a mere example, and those having the substantially same structure as that described in the appended claims and providing the similar action and effects are included in the scope of the present invention.

The foregoing embodiment has been described with reference to the case where an epitaxial layer is grown on the silicon monocrystalline wafer having a diameter of 300 mm. The present invention, however, is not limited to such a case. Even when a silicon wafer having a diameter of 200 mm or more or 400 mm or more is subjected to heat treatment, the same action and effects as those obtained in the aforementioned embodiment are obtained. Conversely, needless to say, even when the present invention is applied to a wafer having a diameter of 150 mm or less, the same advantageous effect is obtained.

Further, the article to be processed by the radiant heating apparatus and method of the present invention is not particularly limited. In addition to semiconductor silicon, various compound semiconductors, and synthetic quartz, oxide monocrystals and various magnetic materials can be subjected to heat treatment so long as the apparatus and/or method of the present invention is applicable to them.

The heat treatment carried out on an article by the radiant heating apparatus and/or method of the present invention is not limited. Examples of the heat treatment include so-called annealing treatment, hydrogen heat treatment, oxygen heat treatment, nitrogen heat treatment, and various kinds of heat treatment in device processing steps such as the step of dopant diffusion, in addition to epitaxial growth and CVD growth process.

What is claimed is:

1. A radiant heating apparatus for heating an article to be treated, comprising:
   a plurality of nested radiant heating units including an outer radiant heating unit and an inner radiant heating unit to heat the article to be treated; and
   a partition wall disposed between the outer radiant heating unit and the inner radiant heating unit and extending toward the article to be treated so as to define an area in which the article to be treated is heated by each radiant heating unit.

2. A radiant heating apparatus according to claim 1, wherein said partition wall is separated at a predetermined distance from the article to be treated, so that the temperature distribution in the article becomes uniform.

3. A radiant heating apparatus according to claim 1, wherein the surface of said partition wall is mirror-finished.

4. A radiant heating apparatus according to claim 1, wherein the surface of said partition wall is mirror-finished.

5. A radiant heating apparatus according to claim 2, wherein the surface of said partition wall is mirror-finished.

6. A radiant heating apparatus according to claim 3, wherein the surface of said partition wall is coated with gold.

7. A radiant heating apparatus according to claim 4, wherein the surface of said partition wall is coated with gold.

8. A radiant heating apparatus according to claim 5, wherein the surface of said partition wall is coated with gold.

9. A radiant heating apparatus according to claim 1, wherein said partition wall is disposed on the side corresponding to the main face of the article to be treated and/or the side corresponding to the reverse face of the article.

10. A radiant heating apparatus according to claim 1, wherein said partition wall is disposed on the side corresponding to the main face of the article to be treated and/or the side corresponding to the reverse face of the article.

11. A radiant heating method which uses a plurality of nested radiant heating units including at least an outer radiant heating unit and an inner radiant heating unit located inside the outer radiant heating unit, wherein a peripheral portion of an article to be treated is mainly heated by said outer radiant heating unit, while a central portion of the article is mainly heated by said inner radiant heating unit, and radiation light emitted by each radiant heating unit is reflected by a partition wall disposed between the outer radiant heating unit and the inner radiant heating unit and extending toward the article to be treated so that the radiation light emitted by each radiant heating unit is separated from that emitted by the other radiant heating units so as to define an area in which the article is heated by each radiant heating unit.

12. A radiant heating method according to claim 11, wherein the radiant intensities of the outer and inner heating units are controlled independently of each other.

13. A radiant heating method according to claim 11, wherein the main face of the article to be treated is heated by said inner and outer radiant heating units disposed on the side corresponding to the main face of the article, while the reverse face of the article is heated by a lower radiant heating unit disposed on the side corresponding to the reverse face of the article.

14. A radiant heating method according to claim 11, wherein the main face of the article to be treated is heated by said outer radiant heating unit disposed on the side corresponding to the main face of the article, while the reverse face of the article is heated by a lower radiant heating unit disposed on the side corresponding to reverse face of the article.

15. A radiant heating method according to claim 11, wherein the article to be treated is a silicon monocrystalline substrate, and a part of the reverse face and/or the side surface of the substrate is supported during treatment.

* * * * *